United States Patent
Tsai et al.

(10) Patent No.: US 7,723,855 B2
(45) Date of Patent: May 25, 2010

(54) PAD AND CIRCUIT BOARD, ELECTRONIC DEVICE USING SAME

(75) Inventors: Shu-Jen Tsai, Taipei Hsien (TW);
Long-Fong Chen, Taipei Hsien (TW);
Wen-Haw Tseng, Taipei Hsien (TW);
Shih-Fang Wong, Taipei Hsien (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 146 days.

(21) Appl. No.: 11/967,098

(22) Filed: Dec. 29, 2007

(65) Prior Publication Data

US 2009/0004501 A1    Jan. 1, 2009

(30) Foreign Application Priority Data

Jun. 29, 2007    (CN) .................... 2007 1 0200974

(51) Int. Cl.
*H01L 23/48*    (2006.01)

(52) U.S. Cl. .............. 257/786; 257/773; 257/775; 257/779; 257/780; 257/784; 361/767; 361/777

(58) Field of Classification Search ......... 257/773–775, 257/779–780, 784, 786; 361/767, 777
See application file for complete search history.

(56) References Cited

U.S. PATENT DOCUMENTS

| | | | | |
|---|---|---|---|---|
| 5,053,850 A | * | 10/1991 | Baker et al. | 257/786 |
| 5,357,060 A | * | 10/1994 | Yamashita | 174/267 |
| 5,553,769 A | * | 9/1996 | Ellerson et al. | 228/123.1 |
| 5,924,623 A | * | 7/1999 | Kenney | 228/180.22 |
| 6,028,366 A | * | 2/2000 | Abe | 257/779 |
| 6,115,262 A | * | 9/2000 | Brunner et al. | 361/774 |
| 6,138,348 A | * | 10/2000 | Kulesza et al. | 29/840 |
| 6,259,038 B1 | * | 7/2001 | Sakaguchi et al. | 174/261 |
| 6,700,204 B2 | * | 3/2004 | Huang et al. | 257/774 |
| 7,064,449 B2 | * | 6/2006 | Lin et al. | 257/786 |
| 7,233,075 B2 | * | 6/2007 | Hung et al. | 257/786 |
| 7,271,439 B2 | | 9/2007 | Park | |

* cited by examiner

*Primary Examiner*—Cathy Lam
(74) *Attorney, Agent, or Firm*—Frank R. Niranjan

(57) ABSTRACT

A pad for soldering a contact of a surface mounted component is provided herein. The pad includes a central portion and a plurality of separate extending portions extending from the central portion. All of the plurality of separate extending portions includes a free end and a connected end connected to the central portion. A width of the free end is larger than a width of the connected end. A circuit board and an electronic device are also provided.

20 Claims, 6 Drawing Sheets

PAD AND CIRCUIT BOARD, ELECTRONIC DEVICE USING SAME

BACKGROUND

1. Technical Field

The present invention relates to surface mount technology (SMT), and more particularly, to an improved pad used for mounting a surface mounted component (SMC) on a circuit board.

2. Description of Related Art

In recent years, surface mount technology (SMT) is being widely used in electronic device manufacturing. SMT is a method for assembling surface mounted components (SMC) onto the surface of printed circuit boards (PCBs). A pin or solder ball of a SMC is usually smaller than its leaded counterpart because it has either smaller leads or no leads at all. It may have short pins or leads of various styles, flat contacts, a matrix of balls (ball grid arrays, BGAs, for example), or terminations on the body of the component.

Ball grid arrays (BGA) accommodates the demands of SMT, and resolves the applications with high density, lower thermal resistance, low inductance leads, improved high speed performances, multiple functions, and high I/O count. However, one disadvantage of the BGA is that the solder balls of the BGA cannot flex in the way that longer leads can, and there is only one juncture between the solder balls and the pads, thus the solder joints fracture (solder-off) easily. Another disadvantage is that once the BGA components are soldered, it is very difficult to detect soldering faults, thus, a quality of the soldering cannot be ensured. Pseudo soldering, and excess solder connections occurs frequently in BGA solder process. These disadvantages which limits the application of BGA also occurs in other surface-mount packaging.

Common pads have different configurations due to varied configurations of the contacts of the electronic elements, such as a circle, a square, a teardrop, and so on. The size of the pads is usually larger than the size of the contacts of the electronic elements corresponding to the pads. When soldering the electronic elements to the circuit board, the contacts of the electronic elements may slide on the pads. As a result, accurate positioning of the electronic elements cannot be assured, pseudo soldering, solder-off, and excess solder connections will also happen.

What is needed, therefore, is an improved pad capable of accurately positioning the electronic element and not become disconnected from the contacts of the electronic element.

SUMMARY

In accordance with one embodiment, A pad for soldering a contact of a surface mounted component is provided herein. The pad includes a central portion and a plurality of separate extending portions extending from the central portion. All of the extending portions include a free end and a connected end connected to the central portion. A width of the free end is larger than a width of the connected end. A circuit board and an electronic device are also provided.

Other advantages and novel features of the present pad, circuit board, and electronic device will become more apparent from the following detailed description of preferred embodiment when taken in conjunction with the accompanying drawings.

DETAILED DESCRIPTION OF THE EMBODIMENTS

The embodiments will now be described in detail below with reference to the drawings.

Figure 1:
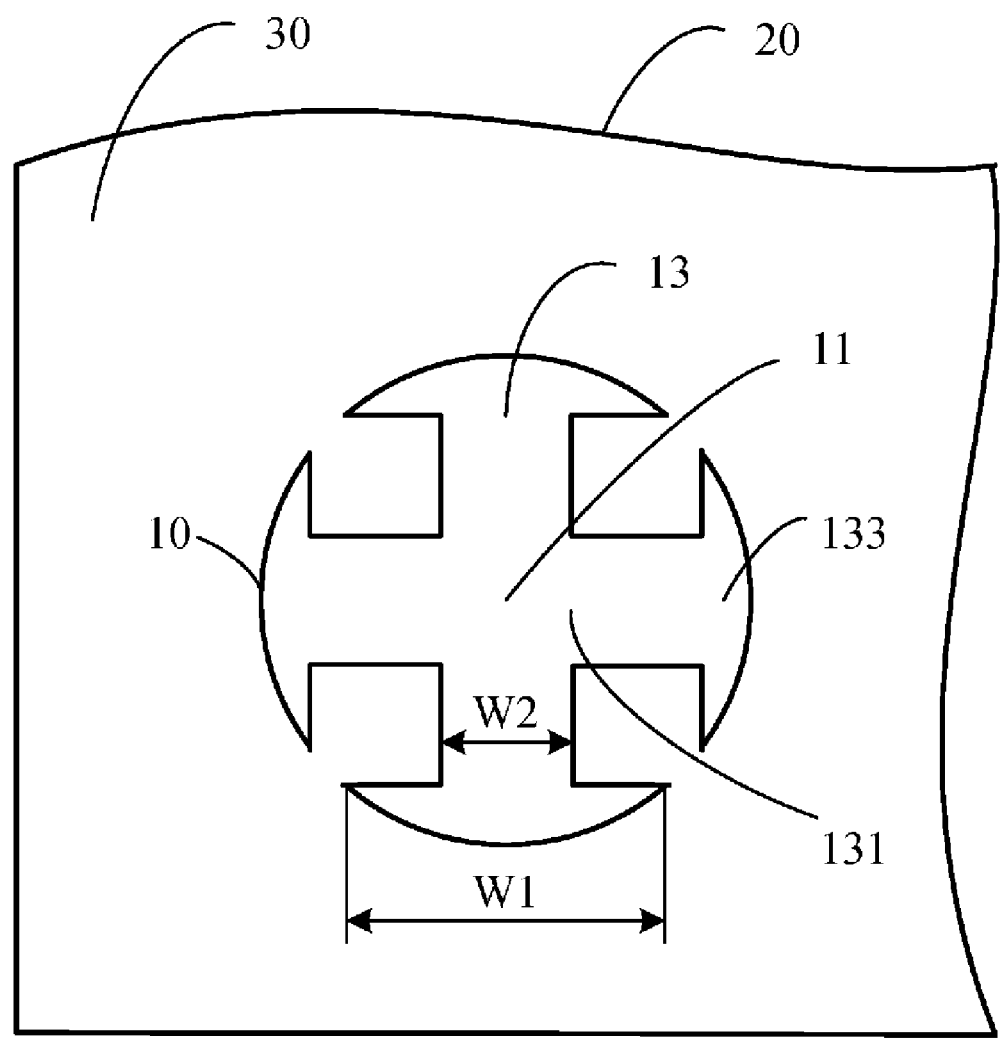
FIG. 1 is a partial top view of a circuit board including a pad thereon in accordance with a first exemplary embodiment.

FIG. 1 is a partial top view of a circuit board 20 in accordance with a first exemplary embodiment. A pad 10 resides on a surface (not labeled) of the circuit board 20, and is surrounded by a solder resist 30 that also resides on the surface of the circuit board 20. The solder resist 30 extends to a periphery of the pad 10. The pads 10 can be formed on the circuit board 20 by chemical etching etc, and a solder paste may be printed onto the pad 10.

The circuit board 20 may be a printed circuit board laminate composed of multiple layers of non-conductive material and conductive traces sandwiched together to form a rigid planar structure. The pad 10 is electrically connected to the conductive traces of the circuit board 20 and is configured for mounting a contact of a surface mounted component (SMC, a resistor, a capacitor, an integrated circuit, an image sensor or the like, for example) in order to electrically connect the SMC and the conductive traces of the circuit board 20. The pad 10 may be bare copper, or copper (Cu) electroplated with at least one of gold (Au), silver (Ag), tin (Sn), aluminum (Al) or other conductive metal materials. The pad 10 may also be a conductive body that contains Ag, Au, Cu, iron (Fe), Al, Sn or other conductive metal materials.

In the present embodiment, the pad 10, by and large, is circular-shaped and its size is equal to or slightly larger than a ordinary circular-shaped pad. The pad 10 includes a square central portion 11 and four separate extending portions 13 extending separately from four sides of the central portion 11. Preferably, the four extending portions 13 are uniformly distributed around the central portion 11. An outline of the extending portion 13 is almost a T-shaped. The extending portion 13 includes a connected end 131 connected to the central portion 11, and a free end 133 with a width W1 larger than a width W2 of the connected end 131.

As the a plurality of extending portions 13 are uniformly distributed around the central portion 11, in the soldering process, liquid surface tension causes the molten solder to hold the contact of the SMC at the central of the pad 10. The solder resist 30 between every two extending portions 13 can prevent the contact of the SMC from sliding out the extending portions 13 in the soldering process. Therefore, the SMC is capable of being positioned on the surface of the circuit board 20 accurately. Also in the soldering process, the central portion 11 and the extending portions 13, can be automatically filled with the molten solder, thus avoiding solder-off, pseudo soldering, excess solder connections, etc. Furthermore, the longest length of the pad 10 is equal to or slightly larger than an ordinary circular-shaped pad, that is, an actual size of the pad 10 is slightly smaller than an ordinary circular-shaped pad, thus, solder paste can be saved.

Particularly, when the contact of the SMC is mounted on the pad 10, all the extending portions 13 and the central portion 11 are connected to the contact, thus there are a plurality of junctures between the pad 10 and the contact, thus, an adhesive strength of the joint between the contact and the pad 10 is strengthened. Furthermore, the width W1 of the free end 133 is larger than the width W2 of the connected end 131, if a juncture between one of the extending portions 13 and the contact fractures, the other junctures between the other extending portions 13 and the contact will not be affected, and the joint between the contact and the pad 10 will not fracture.

Figure 2:
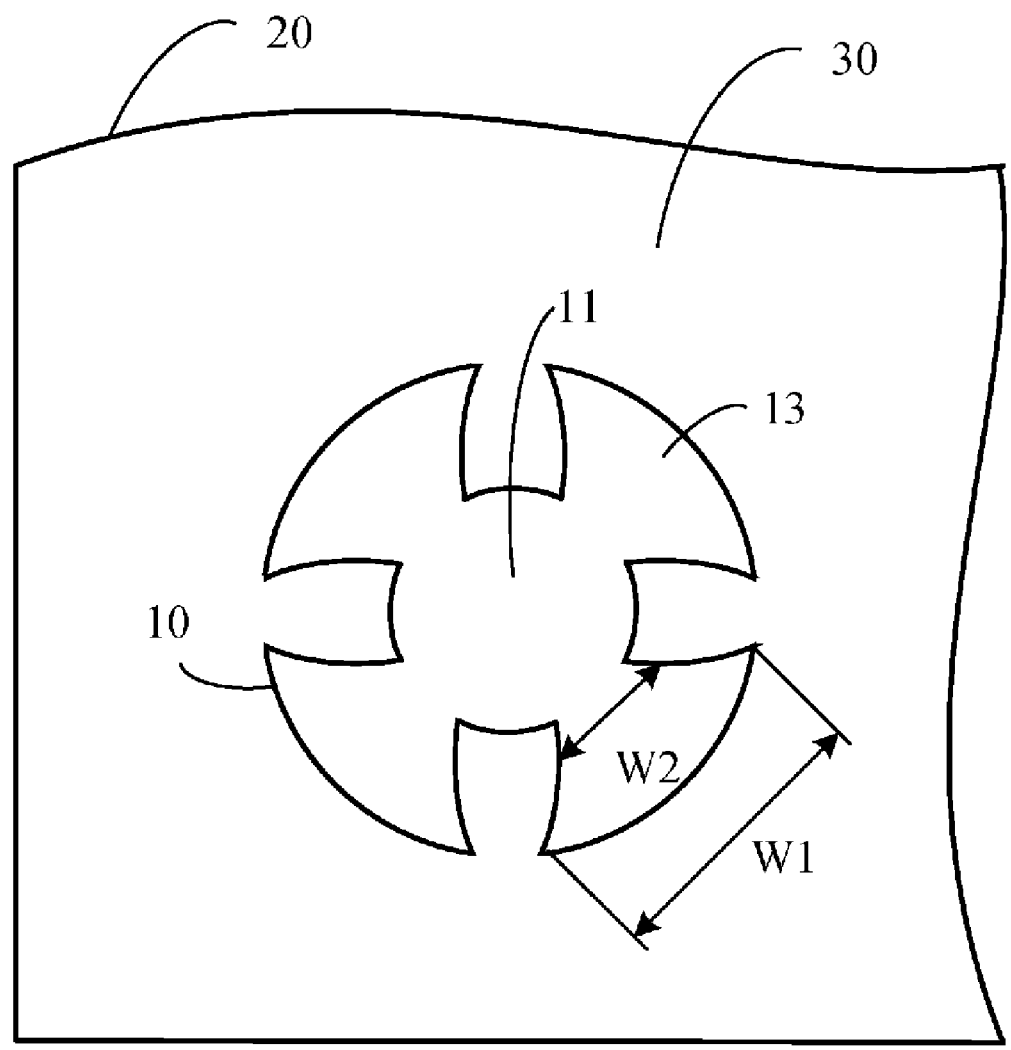
FIG. 2 is a partial top view of a circuit board including a pad thereon in accordance with a second exemplary embodiment.

In other embodiments, variations can be made to the pad 10. For example, FIG. 2 shows the circuit board 20 including at least a pad 10 in accordance with a second exemplary embodiment. In the embodiment, the pad 10, by and large, is circular-shaped, too. The pad 10 includes a circular central portion 11 and four separate extending portions 13 extending separately from the side of the central portion 11. Preferably, the four extending portions 13 are uniformly distributed around the central portion 11. The outline of the extending portion 13 is almost fan-shaped. The extending portion 13 includes a connected end (not labeled) connected to the central portion 11, and a free end (not labeled) with a width W1 larger than a width W2 of the connected end.

Figure 3:
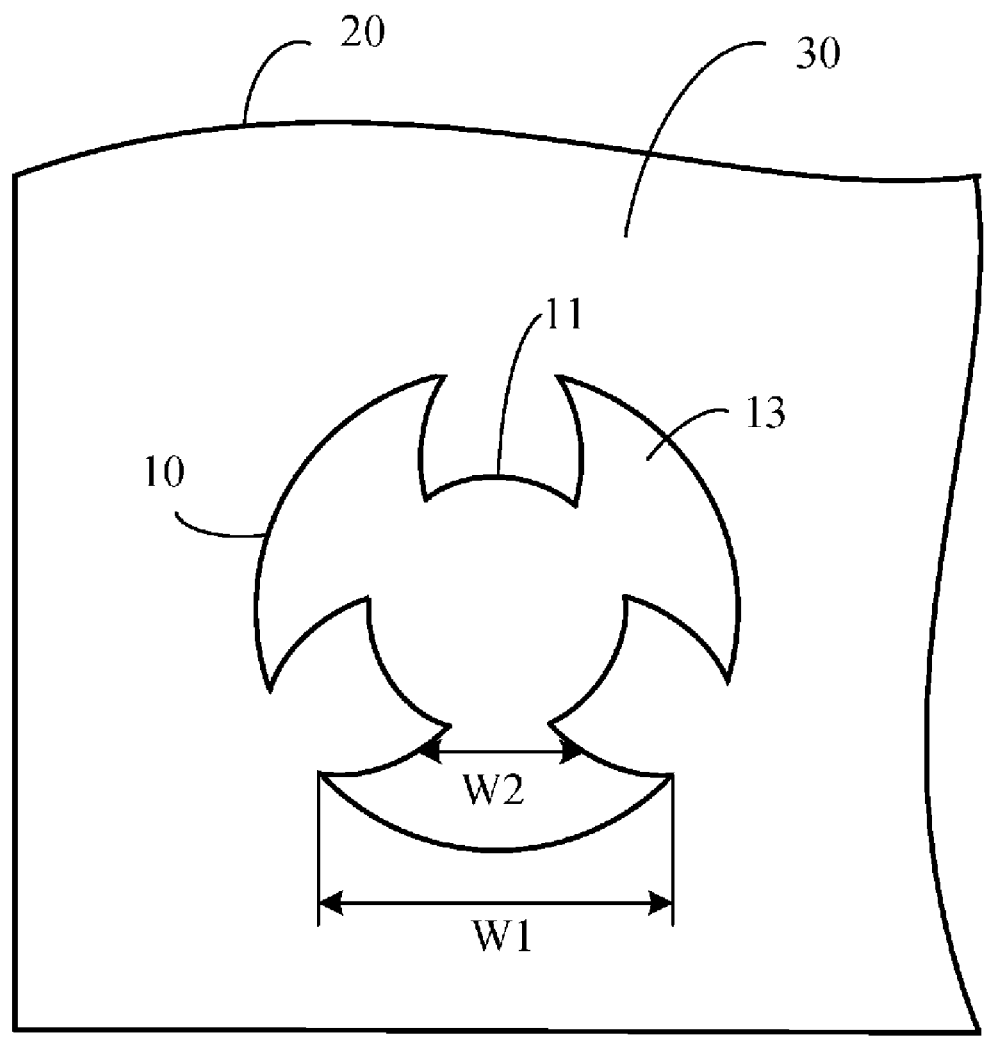
FIG. 3 is a partial top view of a circuit board including a pad thereon in accordance with a third exemplary embodiment.

FIG. 3 shows the circuit board 20 including at least a pad 10 in accordance with a third exemplary embodiment. In the embodiment, the pad 10, by and large, is circular-shaped, too. The pad 10 includes a circular central portion 11 and three separate extending portions 13 extending separately from the side of the central portion 11. Preferably, the three extending portions 13 are uniformly distributed around the central portion 11. The outline of the extending portion 13 is substantially shaped like a fan-blade. The extending portion 13 includes a connected end (not labeled) connected to the central portion 11, and a free end (not labeled) with a width W1 larger than a width W2 of the connected end.

Figure 4:
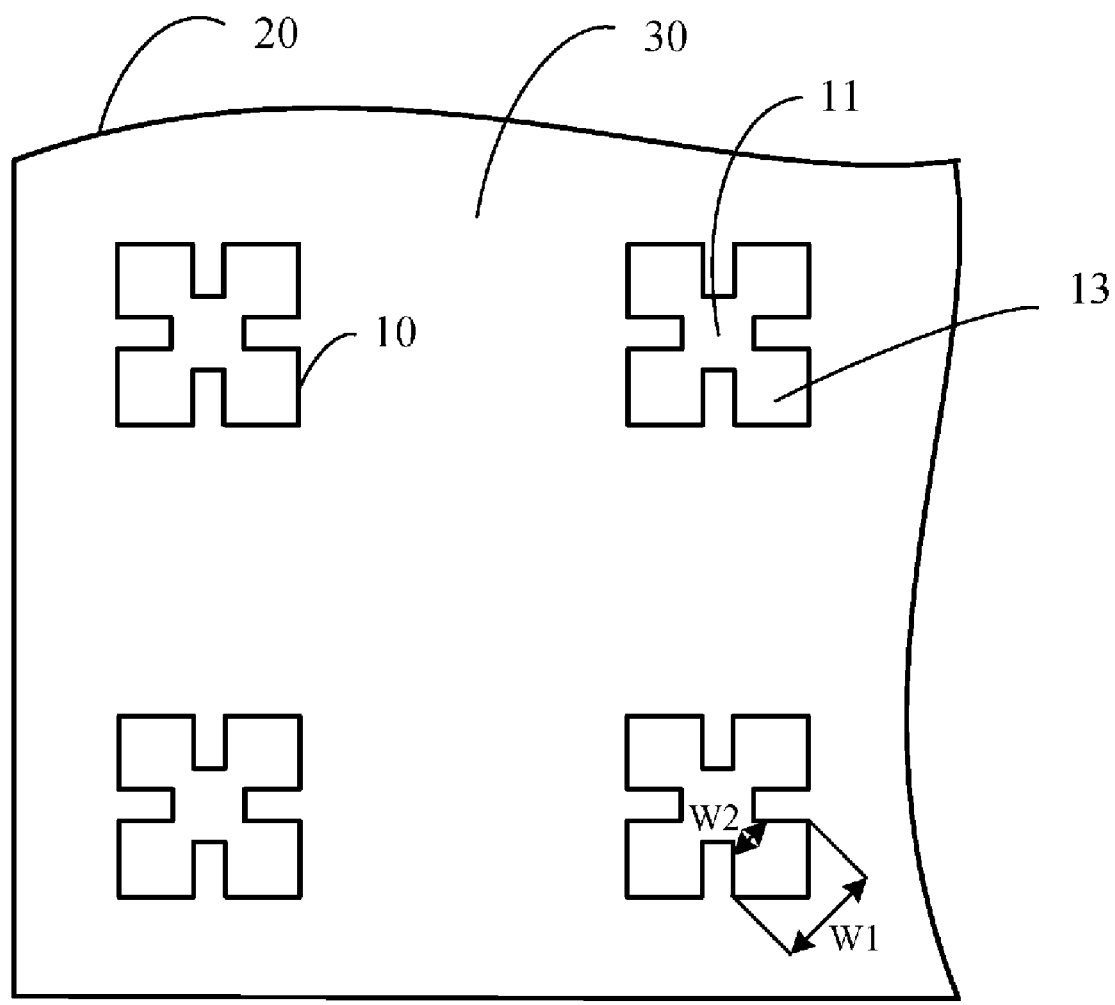
FIG. 4 is a partial top view of a circuit board including four pads thereon in accordance with a fourth exemplary embodiment.

FIG. 4 is a partial top view of the circuit board 20 including at least four pads 10 thereon in accordance with a fourth exemplary embodiment. In the embodiment, each of the pads 10, by and large, is square-shaped. Each of the pads 10 includes a square central portion 11 and four separate extending portions 13 extending separately from the four corners of the central portion 11. Preferably, the four extending portions 13 are uniformly distributed around the central portion 11. The outline of the extending portion 13 is almost diamond-shaped. The extending portion 13 includes a connected end (not labeled) connected to the central portion 11, and a free end (not labeled) with a largest width W1 larger than a width W2 of the connected end.

Figure 5:
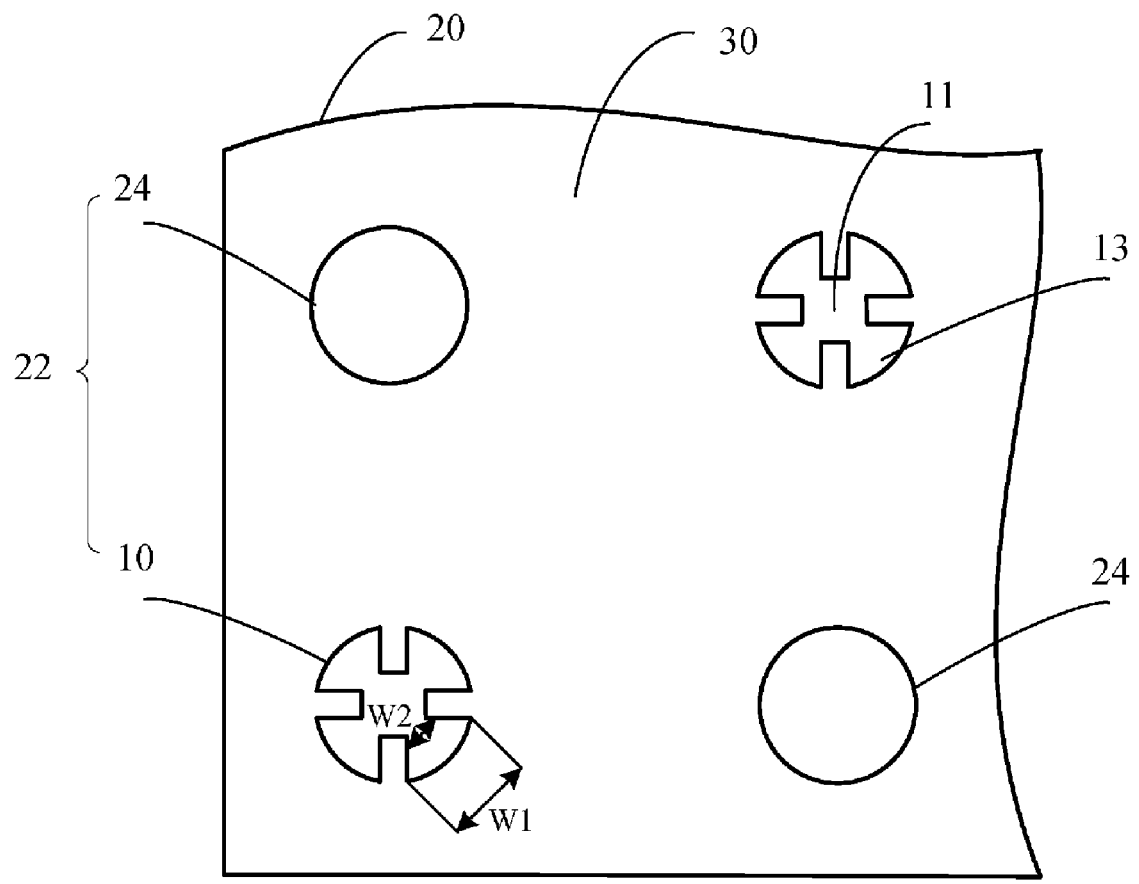
FIG. 5 is a partial top view of a circuit board including four pads thereon in accordance with a fifth exemplary embodiment.

Referring to FIG. 5, the circuit board 20 according to a fifth embodiment includes a pad array 22 with two regular shaped pads 24 and two predeterminedly shaped pads 10. The two pads 10 are disposed diagonally across the pad array 22. The pads 10 are similar to the pads 10 of the circuit board 20 of FIG. 4 except that they have a circular outline. In the embodiment, each of the pads 10, by and large, is square-shaped. Each of the pads 10 includes a square central portion 11 and four separate extending portions 13 extending separately from the four corners of the central portion 11. Preferably, the four extending portions 13 are uniformly distributed around the central portion 11. The outline of the extending portion 13 is almost fan-shaped. The extending portion 13 includes a connected end (not labeled) connected to the central portion 11, and a free end (not labeled) with a width W1 larger than a width W2 of the connected end. It can be easily understood that a proportion between a number of the ordinary shaped pads 24 and a number of the pads 10 can be predeterminedly configured according to need, and the ordinary shaped pads 24 can be circular-shaped, square-shaped, or polygon-shaped pads.

It should be understood that the number of the extending portions 13 of the pad 10 should be equal to or more than three. The central portion 11 can be polygon-shaped. The number of the extending portions 13 of the pad 10 can be decided as needed and is not limited to the particular embodiments described.

Figure 6:
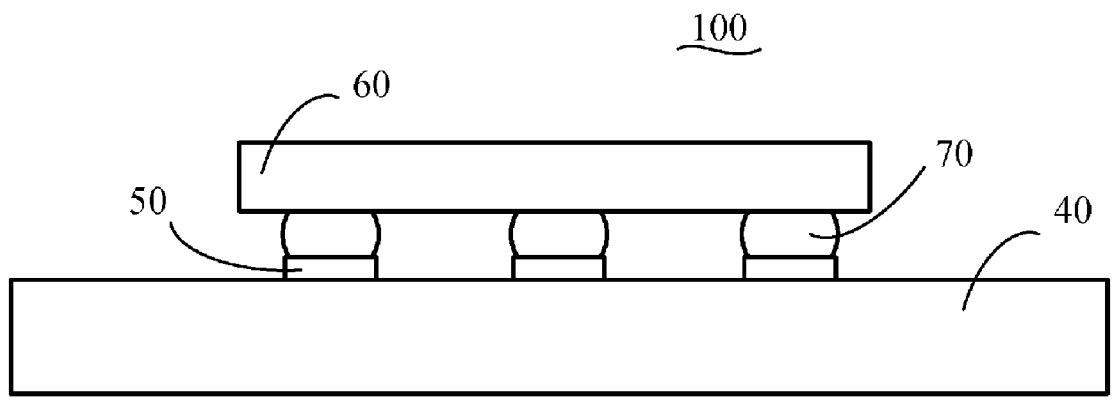
FIG. 6 is a schematic side view of an electronic device according to an exemplary embodiment.

FIG. 6 is a schematic side view of an electronic device 100 according to an exemplary embodiment. The electronic device 100 includes a circuit board 40 and at least a surface mounted component (SMC) 60. The SMC 60 may be a resistor, a capacitor, an integrated circuit, an image sensor or the like. In the embodiment, the SMC 60 is an integrated circuit in BGA package. A plurality of solder balls 70 are stuck to a bottom of the SMC 60. A plurality of pad 50 resides on the surface of the circuit board 40 in a pattern that matches the solder balls 70.

Every pad 50 has a central portion (not shown) and a plurality of separate extending portions (not shown) extending from the central portion. The a plurality of extending portions are uniformly distributed around the central portion. All of the extending portion includes a connected end (not shown) connected to the central portion, and a free end (not shown) with a largest width larger than a largest width of the connected end. A solder paste (not shown) is printed onto the pad 50. A solder resist (not shown) also resides on the surface of the circuit board 40, and extends to peripheries of the pads 50.

In the soldering process, the electronic device 100 is heated, either in a reflow oven or by an infrared heater, causing the solder balls 70 to melt. Surface tension causes the molten solder paste to hold the solder balls and the SMC 60 in alignment with the circuit board 40, at the correct separation distance, while the solder paste cools and solidifies.

As described above, the SMC 60 is capable of being positioned on the surface of the circuit board 40 accurately. Solder-off, pseudo soldering, and excess solder connections can be avoid. Particularly, an adhesive strength of the joint between the solder balls 70 and the pad 50 is strengthened and hardly fractures. Thus, the reliability of the electronic device 100 is ensured.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A pad for soldering a contact of a surface mounted component, the pad comprising:
   a central portion; and
   a plurality of separate extending portions extending from the central portion; wherein each of the plurality of separate extending portions comprises a free end and a connected end connected to the central portion; a width of the free end is larger than a width of the connected end.

2. The pad as claimed in claim 1, wherein the plurality of separate extending portions are uniformly distributed around the central portion.

3. The pad as claimed in claim 2, further comprising a solder paste printed on the pad.

4. The pad as claimed in claim 1, wherein the pad is formed on a circuit board by chemical etching.

5. The pad as claimed in claim 1, wherein the central portion has one of the following shapes: a circle and a polygon.

6. The pad as claimed in claim 2, wherein the central portion is polygon-shaped, the plurality of separate extending portions extend separately from sides or corners of the central portion.

7. A circuit board comprising:
- a pad array, disposed on a surface of the circuit board, for soldering contacts of a surface mounted component; the pad array comprising a plurality of pads; and
- a solder resist disposed on the surface and surrounds the pads; wherein
- at least one of the pads comprises a central portion and a plurality of separate extending portions extending from the central portion; each of the plurality of separate extending portions comprises a free end and a connected end connected to the central portion, a width of the free end is larger than a width of the connected end.

8. The circuit board as claimed in claim 7, wherein the plurality of separate extending portions are uniformly distributed around the central portion.

9. The circuit board as claimed in claim 7, further comprising a solder paste printed on the pad.

10. The circuit board as claimed in claim 7, wherein the pad is formed on a circuit board by chemical etching.

11. The circuit board as claimed in claim 7, wherein the central portion has one of the following shapes: a circle shape and a polygon.

12. The circuit board as claimed in claim 7, wherein the central portion is polygon-shaped, the plurality of separate extending portions extend separately from sides or corners of the central portion.

13. An electronic device comprising a circuit board and a surface mounted component mounted thereon, the circuit board comprising:
- a pad array, disposed on a surface of the circuit board, for soldering contacts of the surface mounted component; the pad array comprising a plurality of pads with at least one pad comprising:
- a central portion; and
- a plurality of separate extending portions extending from the central portion; each of the plurality of separate extending portions comprises a free end and a connected end connected to the central portion, a width of the free end is larger than a width of the connected end.

14. The electronic device as claimed in claim 13, further comprising a solder resist disposed on the surface of the circuit board and surrounding the pads.

15. The electronic device as claimed in claim 13, wherein the plurality of separate extending portions are uniformly distributed around the central portion.

16. The electronic device as claimed in claim 13, further comprising a solder paste printed on the pad.

17. The electronic device as claimed in claim 13, wherein the pad is formed on a circuit board by chemical etching.

18. The electronic device as claimed in claim 13, wherein the central portion has one of the following shapes: a circle shape and a polygon.

19. The electronic device as claimed in claim 13, wherein the central portion is polygon-shaped, the plurality of separate extending portions extend separately from sides or corners of the central portion.

20. The electronic device as claimed in claim 13, wherein the surface mounted component is ball grid arrays components.

* * * * *